United States Patent
Oprescu et al.

(10) Patent No.: US 6,411,242 B1
(45) Date of Patent: Jun. 25, 2002

(54) OVERSAMPLING ANALOG-TO-DIGITAL CONVERTER WITH IMPROVED DC OFFSET PERFORMANCE

(75) Inventors: Florin A. Oprescu, Sunnyvale; William C. Rempfer, Los Altos, both of CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 09/593,021

(22) Filed: Jun. 13, 2000

(51) Int. Cl.[7] .............................................. H03M 1/12
(52) U.S. Cl. ........................................ 341/155; 341/143
(58) Field of Search .................................. 341/155, 143

(56) References Cited

U.S. PATENT DOCUMENTS

| | | | | |
|---|---|---|---|---|
| 4,684,925 A | * | 8/1987 | Maruta | 341/143 |
| 4,704,600 A | * | 11/1987 | Uchimura et al. | 340/347 |
| 4,876,542 A | * | 10/1989 | Van Bavel et al. | 341/143 |
| 4,876,544 A | * | 10/1989 | Kuraishi | 341/166 |
| 5,010,347 A | * | 4/1991 | Yukawa | 341/143 |
| 5,148,167 A | * | 9/1992 | Ribner | 341/143 |
| 5,396,245 A | | 3/1995 | Rempfer | 341/145 |
| 5,450,083 A | * | 9/1995 | Brewer | 341/143 |
| 5,675,334 A | * | 10/1997 | McCartney | 341/118 |
| 5,870,048 A | * | 2/1999 | Kuo et al. | 341/143 |
| 5,982,315 A | * | 11/1999 | Bazarjani et al. | 341/143 |
| 6,037,887 A | * | 3/2000 | Wu et al. | 341/143 |
| 6,057,793 A | * | 5/2000 | Gong et al. | 341/143 |
| 6,198,417 B1 | * | 3/2001 | Paul | 341/143 |
| 6,271,782 B1 | * | 8/2001 | Steensgaard-Madsen | 341/143 |

OTHER PUBLICATIONS

Damien McCartney et al., "A Low–Noise Low Drift Transducer ADC," IEEE J. Solid State Circuits, 32(7):959–967 (Jul. 1997).*

Donald A. Kerth et al., "An Oversampling Converter for Strain Gauge Transducers," IEEE J. Solid State Circuits, 27(12): 1689–96 (Dec. 1992).*

"16–bit/20–Bit Multi–Range ADC x/4–Bit Latch" Crystal Semiconductor Corporation 1996.*

Donald A. Kerth et al., "An Oversampling Converter for Strain GauageTransducers," IEEE J. Solid State Circuits, 27(12):1689–96 (Dec. 1992).

* cited by examiner

Primary Examiner—Michael Tokar
Assistant Examiner—Khai Nguyen
(74) Attorney, Agent, or Firm—Fish & Neave; Joel Weiss; Jared Kneitel

(57) ABSTRACT

The invention provides methods and apparatus for improving the direct current (DC) offset performance of an oversampling analog-to-digital (A/D) converter, including A/D converters that include an oversampling quantizer such as a single or multi-bit Δ-Σ modulator, successive approximation quantizer, flash quantizer, pipelined quantizer or other suitable oversampling quantizer. The invention also relates to methods for providing a wide-band attenuation in the digital output of an A/D converter using a limited number of components.

44 Claims, 4 Drawing Sheets

OVERSAMPLING ANALOG-TO-DIGITAL CONVERTER WITH IMPROVED DC OFFSET PERFORMANCE

FIELD OF THE INVENTION

The present invention relates to oversampling analog-to-digital converters. More particularly, the present invention relates to methods and apparatus for improving the direct current (DC) offset and offset drift performance of an oversampling analog-to-digital converter.

BACKGROUND OF THE INVENTION

Converting a continuous-time analog signal to a discrete-time digital representation typically requires anti-alias filtering, sampling and quantization. An anti-aliasing filter ensures that analog input signal is properly band-limited prior to sampling. A sampler captures samples of the filtered input signal at discrete time intervals $T=1/F_s$, where $F_s$ is the sampling frequency. Sampling frequency $F_s$ typically is selected as at least twice the bandwidth of the filtered analog input signal. A quantizer converts the samples to a discrete set of values. Conventional analog-to-digital (A/D) converters typically perform sampling and quantization, whereas separate discrete components or integrated circuits perform anti-aliasing.

Oversampling A/D converters, in contrast, sample an analog input signal at a rate $NF_s$ that is many times greater than twice the bandwidth of the analog input signal. An oversampling converter typically includes an anti-alias filter, a sampler and modulator (quantizer), and a digital filter. The sampler and quantizer operate at the elevated rate $NF_s$. The digital filter, typically called a decimator, provides low-pass filtering to suppress signals above $F_s/2$, and sample-rate reduction to lower the sample rate to the desired rate $F_s$. As a result of the higher input sampling rate, over-sampling converters have less stringent anti-alias filter requirements than traditional converters. In addition, oversampling converters permit lower quantization noise power, and hence improved signal-to-noise ratio compared to traditional converters.

One key requirement for oversampling A/D converters is low DC offset. If the input to an oversampling A/D converter is zero (e.g., 0 volts), the output of the converter ideally is a digital code corresponding to zero. As a result of component mismatches, however, the output of a real A/D converter to a zero input is a digital code that corresponds to a value other than zero. The magnitude of the converter's input-referred DC offset is the magnitude of the DC input signal that causes the A/D converter to produce a zero output. The DC offset of the converter may vary with time and temperature. This phenomenon typically is called "offset drift." Another key requirement for oversampling A/D converters is low offset drift with time and temperature.

Previously known techniques have been used to improve the DC offset performance of A/D converters. For example, Donald A. Kerth et al., "An Oversampling Converter for Strain Gauge Transducers," IEEE J. Solid State Circuits, 27(12):1689–96 (December 1992), describes an oversampling Δ-Σ A/D converter architecture that uses chopper-stabilized amplifiers to substantially reduce the overall DC offset of the converter. Nevertheless, the non-ideal chopper amplifier switches contribute DC offset and offset drift proportional to the chopper frequency, which corresponds to the relatively high sampling frequency of the Δ-Σ modulator. Although digital calibration techniques may be used to remove residual DC offset, such techniques are ineffective for correcting offset drift. Further, to increase the converter's resolution, the sampling frequency of the Δ-Σ modulator may be increased. Such increases, however, require that the chopper frequency also must increase, which increases residual offset and offset drift.

An improved offset performance A/D converter is described in Damien McCartney et al., "A Low-Noise Low Drift Transducer ADC," IEEE J. Solid State Circuits, 32(7): 959–967 (July 1997) ("McCartney"). The architecture of the McCartney converter is shown in FIG. 1. Converter 10 includes analog chopper 12, buffer amplifier 14, Δ-Σ modulator 16, digital chopper 18, Sinc³ filter and decimator 20, and FIR filter 22. Analog chopper 12 chops analog input signal $V_{IN}$ with a square wave of frequency $f_{chop}$. For example, as described by McCartney, if $V_{IN}$ is a differential signal, analog chopper 12 may be implemented as a multiplexer that successively reverses the polarity of $V_{IN}$. Buffer amplifier 14 isolates the chopped analog input signal from the succeeding switched capacitor circuitry, and may provide adjustable gain. Δ-Σ modulator 16 samples the output of buffer amplifier 14 at a frequency $f_{mod}$ that is much higher than chop frequency $f_{chop}$, and provides a digital data stream at its output. For example, $f_{mod}=2 \times N \times f_{chop}$, where N is the oversampling ratio of Δ-Σ modulator 16. Digital chopper 18 is phase-synchronized with analog chopper 12, and chops the digital data output of Δ-Σ modulator 16 to provide a digital data steam at a rate $f_{mod}$. Sinc³ filter and decimator 20 filter and decimate the output data stream of digital chopper 18 to provide a digital stream x (n) at a rate $f_{mod}/N$.

If chopper frequency $f_{chop}$ equals $f_{mod}/(2 \times N)$, then successive samples x(n) provided at the output of Sinc³ filter and decimator 20 are digital representations of the analog signals $(V_{IN}+V_{OS})$ and $(V_{IN}-V_{OS})$, where $V_{OS}$ is the input-referred offset of buffer amplifier 14 and Δ-Σ modulator 16. For example, x(n) for n=0, −1, −2, 3, −4, may be expressed as:

$$x(0)=(V_{IN}(0)+V_{OS}(0)$$

$$x(-1)=(V_{IN}(-1)-V_{OS}(-1))$$

$$x(-2)=(V_{IN}(-2)+V_{OS}(-2))$$

$$x(-3)=(V_{IN}(-3)-V_{OS}(-3))$$

$$x(-4)=(V_{IN}(-4)+V_{OS}(-4)) \quad (1)$$

where $V_{IN}(n)$, n=0, −1, −2, −3, −4, . . . , are samples of input signal $V_{IN}$, and $V_{OS}(n)$, n=0, −1, −2, −3, −4, . . . , are samples of input-referred offset $V_{OS}$.

FIR filter 22 removes $V_{OS}$ from output x(n) of Sinc³ filter and decimator 20 and provides digital output signal y(n) at rate $f_{chop}$. If FIR filter 22 has L coefficients h(n), n=0, 1, 2, . . . , L−1, output y(n) may be expressed as:

$$y(n) = \sum_{k=0}^{L-1} h(k) \times (n-k) \quad (2)$$

For example, if L=2, output y(n) may be expressed as:

$$y(n)=h(0)x(n)+h(1)x(n-1) \quad (3)$$

For n=0, y(0) equals:

$$y(0) = h(0) \times (0) + h(1) \times (-1) \quad (4a)$$
$$= h(0)[V_{IN}(0) + V_{OS}(0)]$$
$$+ h(1)[V_{IN}(-1) - V_{OS}(-1)] \quad (4b)$$

If $f_{chop}$ is many times higher than twice the bandwidth of $V_{IN}$ and $V_{OS}$, then $$V_{IN}(0) \approx V_{IN}(-1) \quad (5a)$$
$$V_{OS}(0) \approx V_{OS}(-1) \quad (5b)$$

Ideally, y(n) contains no offset $V_{OS}$, such that $$y(n) = V_{IN}(n) \quad (6)$$

Combining equations (4b), (5) and (6), impulse response coefficients h(0)=+0.5 and h(1)=+0.5.

An alternative embodiment of the converter of FIG. 1 is shown in FIG. 2. Circuit 30 includes excitation source 32, analog chopper 34, sensor 36 and A/D converter 38. Excitation source provides analog excitation input signal $E_{IN}$, and sensor 36 may be, for example, a resistor bridge strain gauge used in an industrial weigh scale. Analog excitation input signal $E_{IN}$ typically is a DC signal. Analog chopper 34 chops analog excitation input signal $E_{IN}$, and provides the chopped signal to resistor bridge 36. The analog output of resistor bridge 36 is the input to A/D converter 38. A/D converter 38 includes chop synch 40, which provides analog chopper 34 with a clock signal of the correct polarity and phase to synchronize analog chopper 34 to A/D converter 38. By including sensor 36 in the chop loop, circuit 30 removes offsets in sensor 36 caused by thermal electromotive force (EMF) or leakage current. As described by McCartney, Δ-Σ modulator 16 may be implemented as a 1-bit Δ-Σ modulator, and digital chopper 18 may be implemented as an exclusive-OR gate.

To provide lower quantization error, it may be desirable to implement Δ-Σ modulator 16 as a multi-bit Δ-Σ modulator (i.e., a modulator that provides a multi-bit digital output data stream). Alternatively, it may be desirable to implement modulator 16 using other oversampling quantizer architectures (e.g., successive approximation, flash, or pipelined quantizers) that provide multi-bit digital representations of the signal applied to the quantizer's input. In such multi-bit implementations, digital chopper 18 may not be implemented using a simple exclusive-or gate, but instead requires more complex circuitry.

It therefore would be desirable to provide an oversampling analog-to-digital converter that includes a multi-bit quantizer and that has reduced DC offset and offset drift.

It also would be desirable to provide an oversampling analog-to-digital converter that includes a multi-bit Δ-Σ modulator and that has reduced DC offset and offset drift.

It further would be desirable to provide an oversampling analog-to-digital converter that has reduced DC offset and offset drift, but that does not require a digital chopper stage.

SUMMARY OF THE INVENTION

Accordingly, it is an object of this invention to provide an oversampling analog-to-digital converter that includes a multi-bit quantizer and that has reduced DC offset and offset drift.

It also is an object of this invention to provide an oversampling analog-to-digital converter that includes a multi-bit Δ-Σ modulator and that has reduced DC offset and offset drift.

It further is an object of this invention to provide an oversampling analog-to-digital converter that has reduced DC offset and offset drift, but that does not require a digital chopper stage.

In accordance with these and other objects of the present invention, an oversampling A/D converter is provided that includes an analog chopper, a buffer amplifier, an oversampling quantizer (such as a single or multi-bit Δ-Σ modulator, successive approximation quantizer, flash quantizer, pipelined quantizer or other suitable oversampling quantizer), a first digital filter and decimator, and a second digital filter and decimator.

BRIEF DESCRIPTION OF THE DRAWINGS

The above-mentioned objects and features of the present invention can be more clearly understood from the following detailed description considered in conjunction with the following drawings, in which the same reference numerals denote the same structural elements throughout, and in which.

DETAILED DESCRIPTION OF THE INVENTION

Figure 3:
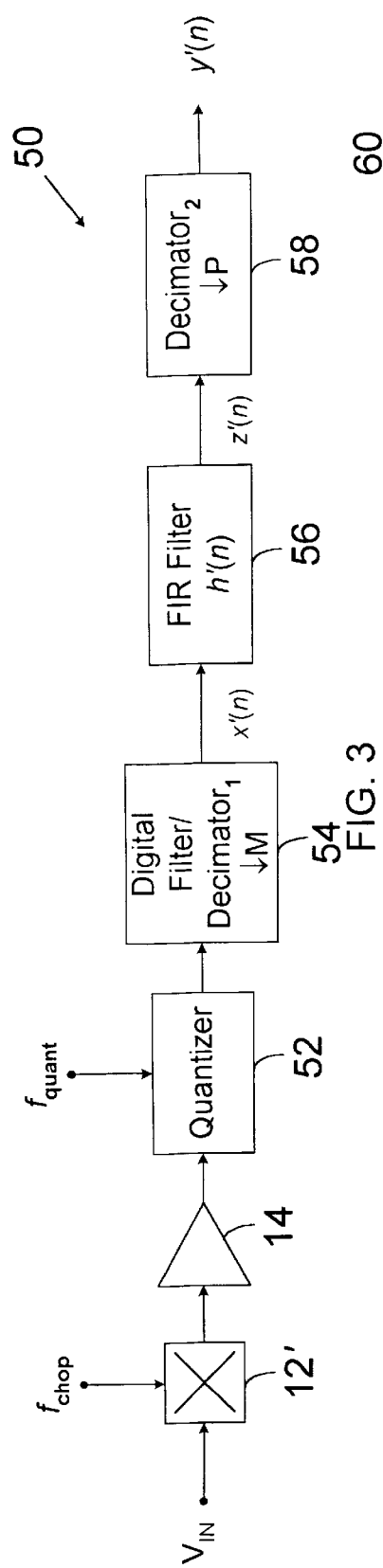
FIG. 3 is a block diagram of an A/D converter circuit of this invention.

Referring to FIG. 3, an improved A/D converter in accordance with principles of the present invention is described. A/D converter 50 includes analog chopper 12', buffer amplifier 14, quantizer 52, digital filter and decimator$_1$ 54, FIR filter 56 and decimator$_2$ 58.

Figure 4:
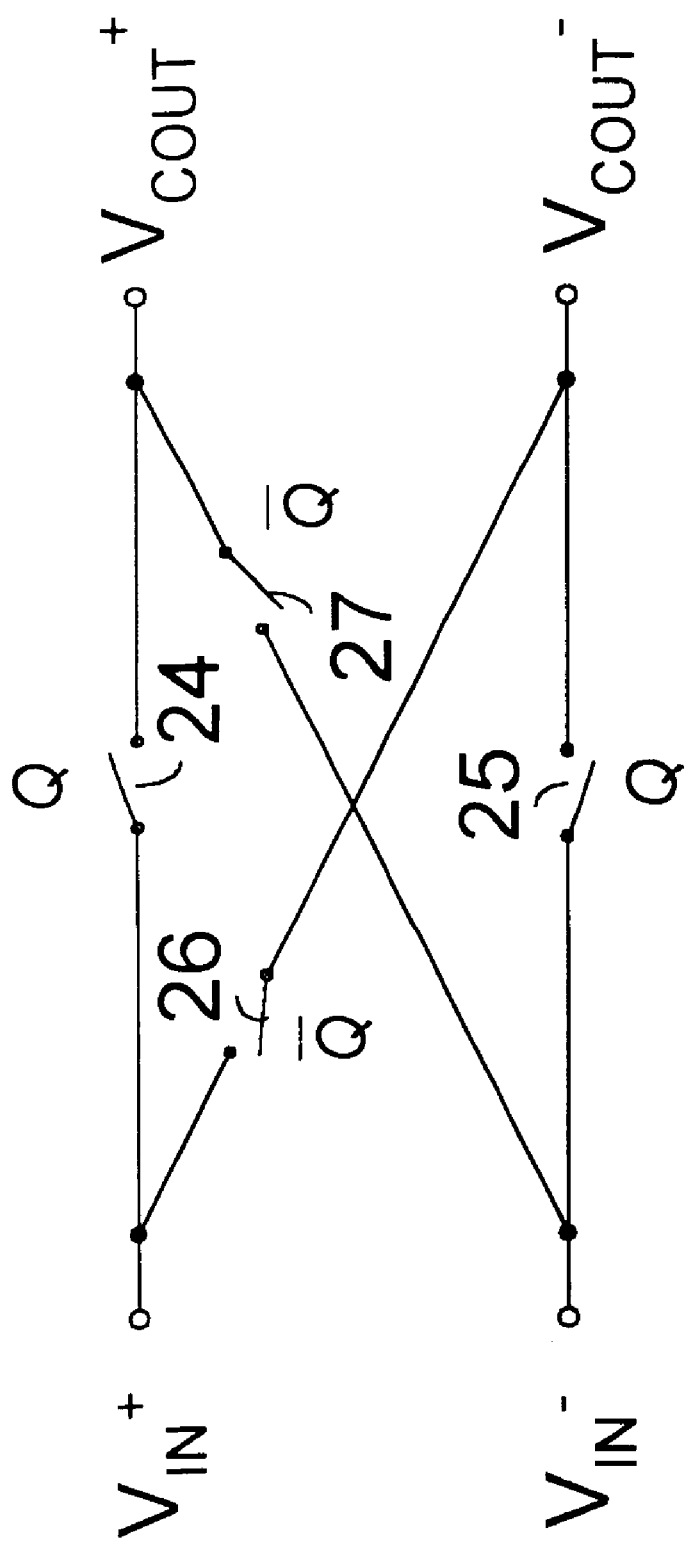
FIG. 4 is a schematic diagram of exemplary analog chopper circuitry of FIG. 3.

Analog chopper 12' chops analog input signal $V_{IN}$ with a square wave of frequency $f_{chop}$, which successively reverses the polarity of $V_{IN}$. Analog chopper 121 may be implemented using any well-known analog chopping circuitry. For example, as shown in FIG. 4, if input signal $V_{IN}$ is a differential signal $V_{IN}=(V_{IN}^+-V_{IN}^-)$, analog chopper 12' may be implemented using cross-coupled switches 24, 25, 26, and 27. Switch 24 is controlled by chop signal Q, and is coupled between $V_{IN}^+$ and $V_{COUT}^+$. Switch 25 is controlled by chop signal Q, and is coupled between $V_{IN}^-$ and $V_{COUT}^-$. Switch 26 is controlled by complementary chop signal $\overline{Q}$, and is coupled between $V_{IN}^+$ and $V_{COUT}^-$. Switch 27 is controlled by complementary chop signal $\overline{Q}$. and is coupled between $V_{IN}^-$ and $V_{COUT}^+$. Chop signals Q and $\overline{Q}$ are complementary logic signals of frequency $f_{chop}$. For example, when Q is HIGH and $\overline{Q}$ is LOW, $V_{COUT}^+=V_{IN}^+$, and $V_{COUT}^-=V_{IN}^-$. When $\overline{Q}$ is HIGH and Q is LOW, $V_{COUT}^+=V_{IN}^-$ and $V_{COUT}^-=V_{IN}^+$. Analog chopper 12' alternatively may be implemented using multiplexer circuitry as described by McCartney, analog multiplier circuitry, or any other suitable analog chopper circuitry.

Buffer amplifier 14 couples the output of analog chopper 12' to quantizer 52, which may be any conventional oversampling quantizer, such as a single or multi-bit Δ-Σ modulator, successive approximation quantizer, flash quantizer, pipelined quantizer, or other suitable oversampling quantizer. Quantizer 52 provides a digital output at a rate $f_{quant}$ that is substantially higher than $f_{chop}$.

The digital output of quantizer 52 is the input to digital filter and decimator$_1$ 54, which includes a digital filter and a decimator that reduces the output data rate by a factor of M. For example, digital filter and decimator$_1$ 54 may be implemented using Sinc$^3$ filter and decimator 20 (FIG. 1), in which M equals the oversampling ratio N of quantizer 52. Alternatively, digital filter and decimator$_1$ 54 may be any other suitable digital filter and decimator.

Digital filter and decimator$_1$ 54 provide an output sequence x'(n) at a rate $f_{quant}$/M. If control frequency $f_{chop}$ to analog chopper 12' equals $f_{quant}/(2 \times M)$ then successive output samples x'(n) of digital filter and decimator$_1$ 54 are digital representations of the analog signals $(V_{IN}+V_{OS})$ and $-(V_{IN}-V_{OS})$, where $V_{OS}$ is the input-referred offset of buffer amplifier 14 and quantizer 52. For example, x'(n) for n=0, -1, -2, 3, -4 may be expressed as:

$$x'(0)=+(V_{IN}(0)+V_{OS}(0))$$
$$x'(-1)=-(V_{IN}(-1)-V_{OS}(-1))$$
$$x'(-2)=+(V_{IN}(-2)+V_{OS}(-2))$$
$$x'(-3)=-(V_{IN}(-3)-V_{OS}(-3))$$
$$x'(-4)=+(V_{IN}(-4)+V_{OS}(-4)) \tag{7}$$

Comparing equations (1) and (7), sequence x'(n) may be expressed as:

$$x'(n)=(-1)^n x(n), n=0, -1, -2, \tag{8}$$

FIR filter 56 removes $V_{OS}$ from sequence x(n) If FIR filter 56 has L coefficients h'(n), n=0, 1, 2, ..., L−1, output z'(n) of FIR filter 56 may be expressed as:

$$z'(n) = \sum_{k=0}^{L-1} h'(k) \times '(n-k) \tag{9}$$

Combining equations (8) and (9), output z'(n) may be expressed as:

$$z'(n) = (-1)^n \sum_{k=0}^{L-1} (-1)^{-k} h'(k) \times (n-k) \tag{10}$$

Decimator$_2$ 58 reduces the data rate by a factor P, which is an even integer greater than or equal to 2. That is, from every block of P successive samples z'(n), decimator$_2$ 58 provides the first sample at its output y'(n), and discards the remaining P−1 samples. Output y'(n) is at a rate $f_{quant}/(M \times P)$. For example, if P=2, output y'(n) is at a rate $f_{chop}$.

Because P is an even integer, the phase relation between analog chopper 12' and decimator$_2$ 58 may be set so that y'(n) is chosen for n always even or n always odd. If n is even, output y'(n) may be expressed as:

$$y'(n) = \sum_{k=0}^{L-1} (-1)^{-k} h'(k) \times (n-k) \tag{11}$$

Ideally, y'(n) contains no offset $V_{OS}$, such that $$y'(n)=V_{IN}(n) \tag{12}$$

From equations (2), (6), (11) and (12), therefore, $$\sum_{k=0}^{L-1} h(k) \times (n-k) = \sum_{k=0}^{L-1} (-1)^{-k} h'(k) \times (n-k) \tag{13}$$

and therefore coefficients h'(n) may be expressed as:

$$h'(n)=(-1)^n h(n), n=0, 1, 2, \ldots, L-1 \tag{14}$$

Thus, for n even, coefficients h'(n) of FIR filter 56 equal coefficients h(n) of prior art FIR filter 22, but with the sign reversed for all odd coefficients.

Alternatively, if n is odd, output y'(n) may be expressed as:

$$y'(n) = \sum_{k=0}^{L-1} (-1)^{-(k-1)} h'(k) \times (n-k) \tag{15}$$

Ideally, y'(n) contains no offset $V_{OS}$, such that $$y'(n)=V_{IN}(n) \tag{16}$$

From equations (2), (6), (15) and (16), therefore, $$\sum_{k=0}^{L-1} h(k) \times (n-k) = \sum_{k=0}^{L-1} (-1)^{-(k-1)} h'(k) \times (n-k) \tag{17}$$

and therefore coefficients h'(*n*) may be expressed as:

$$h'(n)=(-1)^{(n-1)} h(n), n=0, 1, 2, \ldots, L-1 \tag{18}$$

Thus, for n odd, coefficients h'(n) of FIR filter 56 equal coefficients h(n) of prior art FIR filter 22, but with the sign reversed for all even coefficients.

Figure 2:
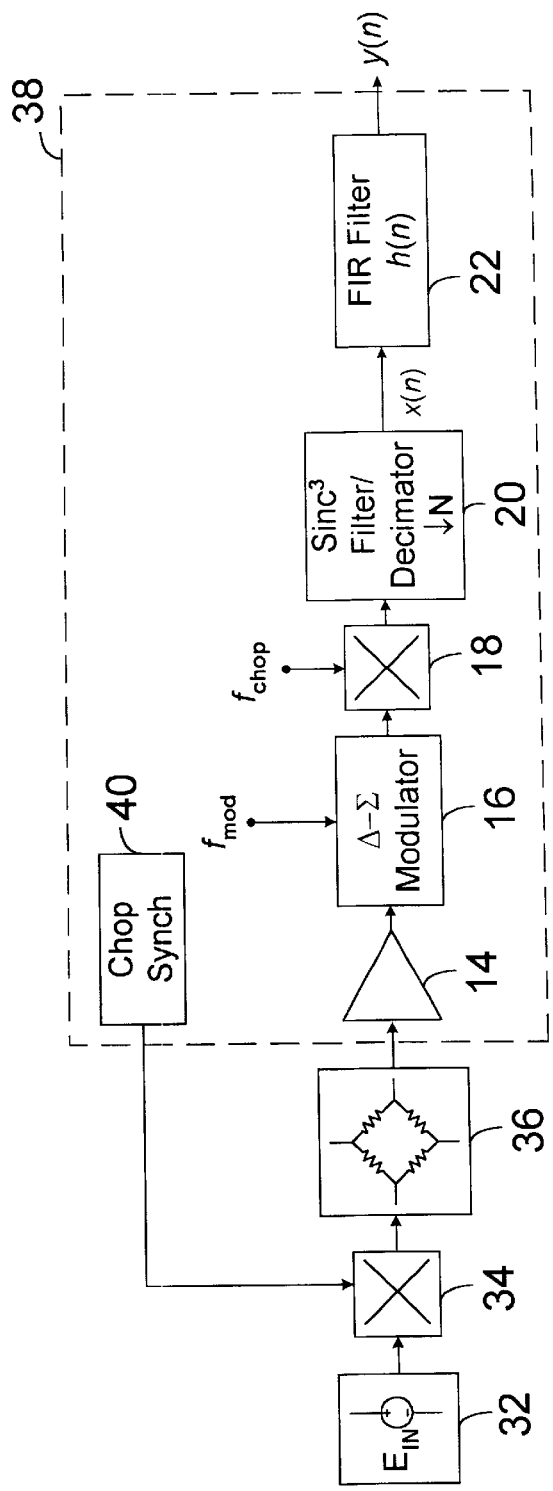
FIG. 2 is a block diagram of another previously known A/D converter circuit.
Figure 5:
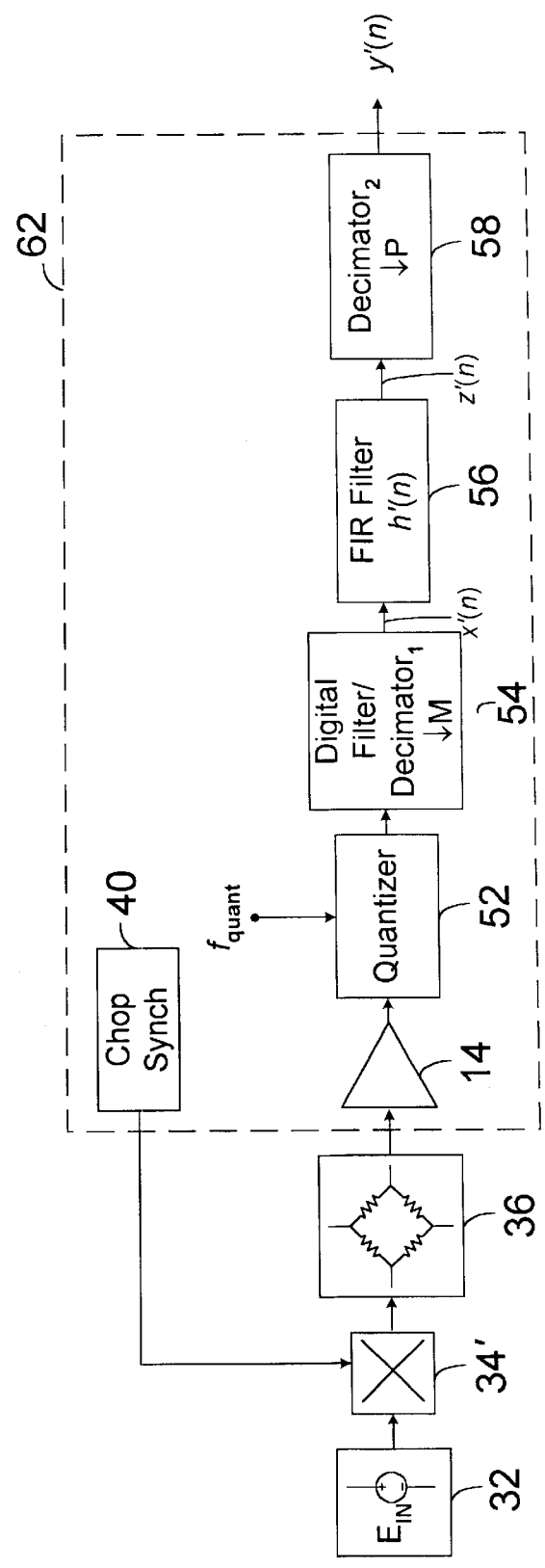
FIG. 5 is a block diagram of another A/D converter circuit of this invention.

FIG. 5 illustrates another converter circuit of this invention that includes a sensor within the chopped conversion chain. Circuit 60 includes excitation source 32, analog chopper 34'and sensor 36, and A/D converter 62. A/D converter 62 includes chop synch 40 (as in FIG. 2), and includes buffer amplifier 14, quantizer 52, digital filter and decimator$_1$ 54, FIR filter 56 and decimator$_2$ 58 (as in FIG. 3). Converter 60 reduces thermal EMF errors due to sensor interconnects and also reduces offset, offset drift and 1/f noise errors produced by buffer amplifier 14 and quantizer 52.

In another aspect of the invention, a method of attenuating a converted digital signal over a wide null band—e.g., from 48 Hz to 62 Hz—is provided. Using conventional methods to produce a wide null band requires complex filter circuitry that is difficult to fabricate and occupies a substantial amount of die space. In a method for producing a wide null band according to the invention, the band is produced using substantially fewer components and less complex circuitry than by conventional methods.

Figure 1:
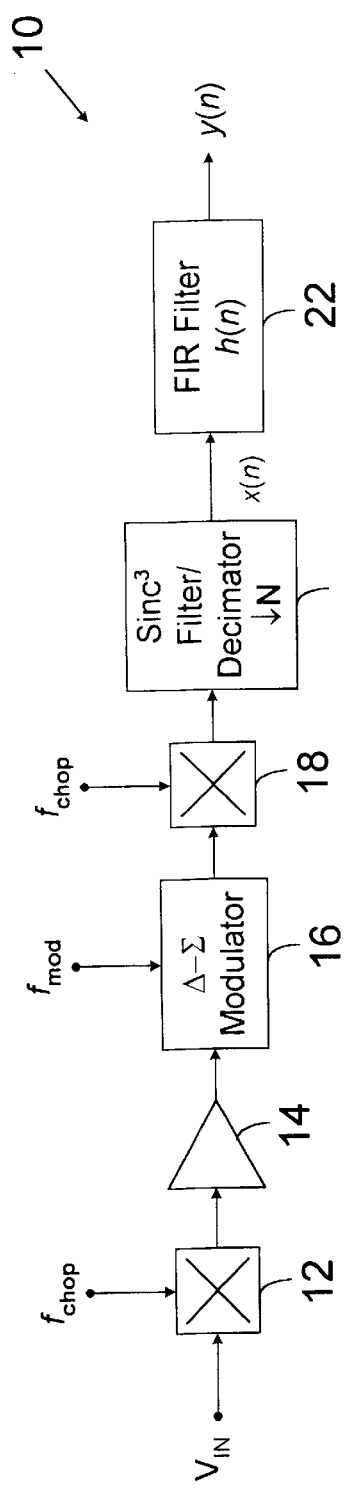
FIG. 1 is a block diagram of a previously known A/D converter circuit.

Two examples of circuits which can be used to implement the method according to the invention are shown in FIGS. 1 and 3. To produce the desired null band, this method requires only a cascade connection of the two digital filters/decimators. Therefore, the method of the invention can operate with or without the second digital chopper 18 (as in the circuit shown in FIG. 1) or by modifying the sign of the coefficients of the second digital filter/decimator (as in the circuit in FIG. 3).

More specifically, the circuit shown in FIG. 1 can be used in a method according to the invention by implementing FIR filter 22 with two equal coefficients of ½{h(0)=h(1)=0.5} and, filter 20 as a sinc$^4$ filter. Alternatively, the method can be implemented using the circuit shown in FIG. 3. To accomplish this, the digital filter/decimator 54 can be implemented as a sinc$^4$ with an impulse response of total length 4*k and a decimation factor M=4*k (F1=Fs/(4*k)) and the digital filter/decimator 58 can be implemented as an FIR of length 2 with coefficients h(0)=−h(1)=0.5 or h(0)=−h(1)=−0.5 and decimation factor P=2 (Fout=Fs/(8*k)). The actual value of k typically has little influence over the described invention. Nevertheless, a common value selected in such configurations is k=256. The notch, or center, frequency Fo can again be defined as Fo=Fs/k.

The attenuation of the input signal magnitude around the notch frequency, Fo, due to such an implementation can be written as:

$$H(f) = 20 \times \log_{10} \left| \left( \frac{\sin(\pi \times f / Fo)}{k \times \sin(\pi \times f / k \times Fo)} \right)^4 \times \frac{\sin(8 \times \pi \times f / Fo)}{2 \times \sin(4 \times \pi \times f / Fo)} \right| \quad (19)$$

It should be noted that the method according to invention is not limited to these particular circuit configurations but, rather, these are only exemplary configurations of circuits that produce the results required by the method of the invention.

Figure 6:
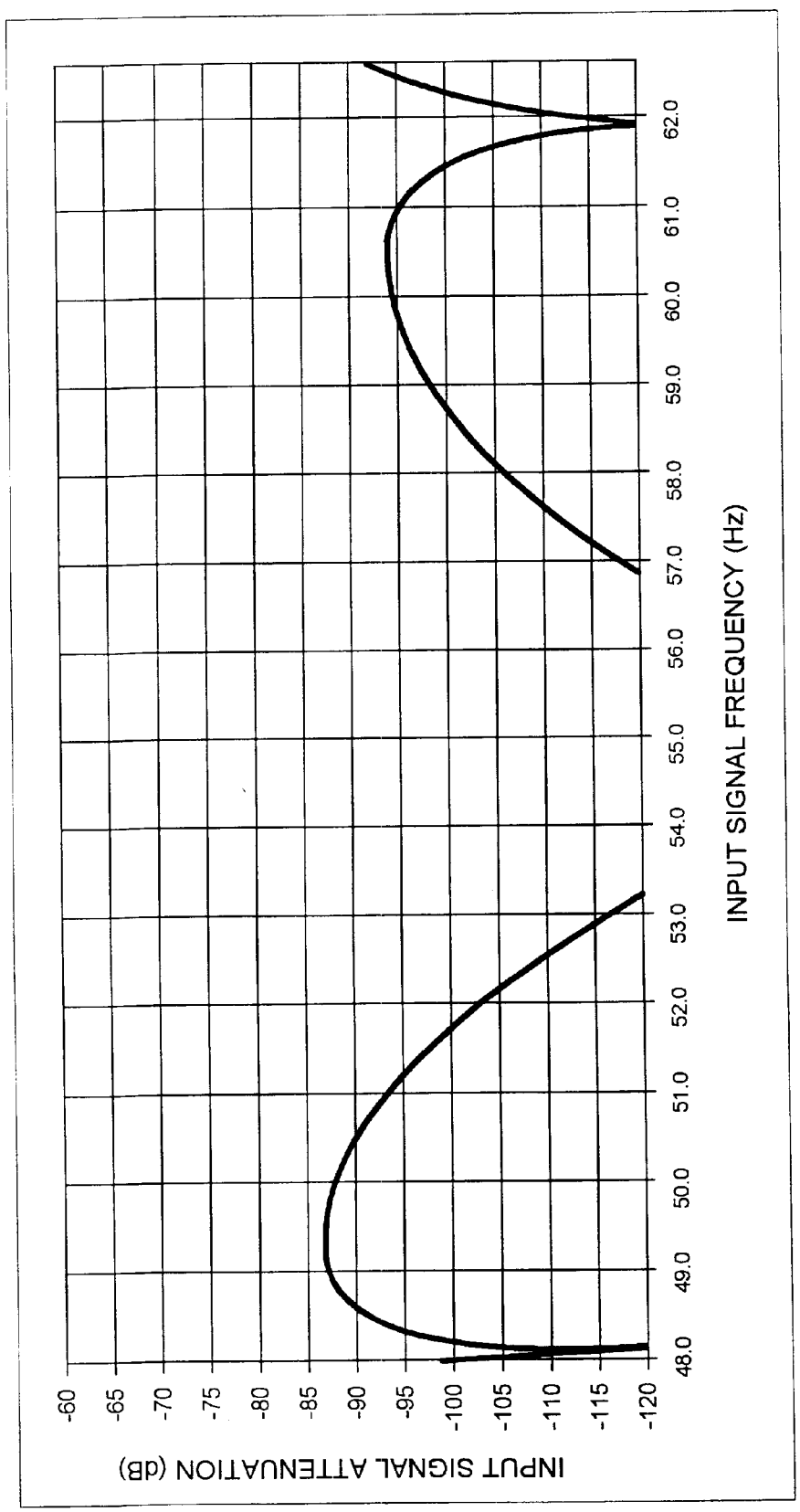
FIG. 6 is a diagram of frequency response of a circuit according to the invention.

FIG. 6 shows one preferable frequency response that is obtainable according to the method of the invention. In this particular response, an Fclk signal is selected such that Fs=55*k Hz, which provides a corner frequency of Fo=Fs/k=55 Hz. It is shown in FIG. 6, that an implementation according to the invention provides better than about 87 dB of input perturbation rejection in a frequency range of 48 Hz (=50 Hz−4%) to 62.5 Hz (=60 Hz+4%), or about+−14% of the corner frequency. For many applications, this level of rejection is sufficient. Furthermore, in this particular embodiment, attenuation that extends about +−14% around a center frequency of about 55 Hz, or other center frequency chosen to provide coverage of the 50 Hz and 60 Hz power line frequencies, also provides a substantial advantage. It should be noted that the invention is not limited to this particular range.

Persons skilled in the art further will recognize that the circuitry of the present invention may be implemented using circuit configurations other than those shown and discussed above. All such modifications are within the scope of the present invention, which is limited only by the claims that follow.

What is claimed is:

1. A circuit for converting an analog input at an input terminal to a digital output at an output terminal, the circuit comprising:
   an analog chopper circuit having an input coupled to the input terminal, and providing an output at a first predetermined rate $f_{chop}$;
   a quantizer circuit having an input coupled to the output of the analog chopper circuit, and providing an output at a second predetermined rate $f_{quant}$;
   a first digital filter and first decimator having an input coupled to the output of the quantizer circuit, and providing an output at a rate $f_{quant}$ divided by M ($f_{quant}/M$);
   a second digital filter having an input coupled to the output of the first digital filter and first decimator; and
   a second decimator having an input coupled to the output of the second digital filter, and providing the digital output at a rate $f_{quant}$ divided by M times P ($f_{quant}/(M \times P)$).

2. The circuit of claim 1, wherein the quantizer is a Δ-Σ modulator.

3. The circuit of claim 1, wherein the quantizer is a single-bit Δ-Σ modulator.

4. The circuit of claim 1, wherein the quantizer is a multi-bit Δ-Σ modulator.

5. The circuit of claim 1, wherein the quantizer is a successive approximation quantizer.

6. The circuit of claim 1, wherein the quantizer is a flash quantizer.

7. The circuit of claim 1, wherein the quantizer is a pipelined quantizer.

8. The circuit of claim 1, wherein the first predetermined frequency $f_{chop}$ equals the second predetermined frequency $f_{quant}$ divided by two times M ($f_{chop}=f_{quant}/(2 \times M)$).

9. The circuit of claim 1, wherein P=2.

10. A circuit for converting a differential analog input at a pair of differential input terminals to a digital output at an output terminal, the circuit comprising:
    a cross-coupled switch having a first input coupled to one of the pair of differential input terminals and a second input coupled to the other of the pair of differential input terminals, and providing a differential output at a first predetermined rate $f_{chop}$;
    a quantizer circuit having a differential input coupled to the differential output of the analog chopper circuit, and providing an output at a second predetermined rate $f_{quant}$;
    a first digital filter and first decimator having an input coupled to the output of the quantizer circuit, and providing an output at a rate $f_{quant}$ divided by M ($f_{quant}/M$);
    a second digital filter having an input coupled to the output of the first digital filter and first decimator; and
    a second decimator having an input coupled to the output of the second digital filter, and providing the digital output at a rate $f_{quant}$ divided by M times P ($f_{quant}/(M \times P)$).

11. The circuit of claim 10, wherein the quantizer is a Δ-Σ modulator.

12. The circuit of claim 10, wherein the quantizer is a single-bit Δ-Σ modulator.

13. The circuit of claim 10, wherein the quantizer is a multi-bit Δ-Σ modulator.

14. The circuit of claim 10, wherein the quantizer is a successive approximation quantizer.

15. The circuit of claim 10, wherein the quantizer is a flash quantizer.

16. The circuit of claim 10, wherein the quantizer is a pipelined quantizer.

17. The circuit of claim 10, wherein the first predetermined frequency $f_{chop}$ equals the second predetermined frequency $f_{quant}$ divided by two times M ($f_{chop}=f_{quant}/(2 \times M)$).

18. The circuit of claim 10, wherein P=2.

19. A circuit for converting a differential analog input at an input terminal to a digital output at an output terminal, the circuit comprising:
    an analog multiplier having a first input coupled to the input terminal, and providing an output at a first predetermined rate $f_{chop}$;
    a quantizer circuit having an input coupled to the output of the analog chopper circuit, and providing an output at a second predetermined rate $f_{quant}$;
    a first digital filter and first decimator having an input coupled to the output of the quantizer circuit, and providing an output at a rate $f_{quant}$ divided by M ($f_{quant}/M$);

a second digital filter having an input coupled to the output of the first digital filter and first decimator; and a second decimator having an input coupled to the output of the second digital filter, and providing the digital output at a rate $f_{quant}$ divided by M times P ($f_{quant}/(M \times P)$).

20. The circuit of claim 19, wherein the quantizer is a Δ-Σ modulator.

21. The circuit of claim 19, wherein the quantizer is a single-bit Δ-Σ modulator.

22. The circuit-of claim 19, wherein the quantizer is a multi-bit Δ-Σ modulator.

23. The circuit of claim 19, wherein the quantizer is a successive approximation quantizer.

24. The circuit of claim 19, wherein the quantizer is a flash quantizer.

25. The circuit of claim 19, wherein the quantizer is a pipelined quantizer.

26. The circuit of claim 19, wherein the first predetermined frequency $f_{chop}$ equals the second predetermined frequency $f_{quant}$ divided by two times M ($f_{chop}=f_{quant}/(2 \times M)$).

27. The circuit of claim 19, wherein P=2.

28. A circuit for converting a differential analog input at a pair of differential input terminals to a digital output at an output terminal, the circuit comprising:

a multiplexer having a first input coupled to one of the pair of differential input terminals and a second input coupled to the other of the pair of differential input terminals, and providing a differential output at a first predetermined rate $f_{chop}$;

a quantizer circuit having a differential input coupled to the differential output of the analog chopper circuit, and providing an output at a second predetermined rate $f_{quant}$;

a first digital filter and first decimator having an input coupled to the output of the quantizer circuit, and providing an output at a rate $f_{quant}$ divided by M ($f_{quant}/M$);

a second digital filter having an input coupled to the output of the first digital filter and first decimator; and a second decimator having an input coupled to the output of the second digital filter, and providing the digital output at a rate $f_{quant}$ divided by M times P ($f_{quant}/(M \times P)$).

29. A method of converting an analog input at an input terminal to a digital output at an output terminal, the method comprising:

chopping the analog input with a chop signal to provide a chopped signal at a first predetermined rate $f_{chop}$;

quantizing the chopped signal to provide a quantized signal at a second predetermined rate $f_{quant}$;

digitally filtering the quantized signal to provide a first filtered signal;

decimating the first filtered signal by a factor M to provide a first decimated signal at a rate $f_{quant}$ divided by M ($f_{quant}/M$);

digitally filtering the first decimated filter to provide a second filtered signal; and decimating the second filtered signal by a factor P to provide the digital output at a rate $f_{mquant}$ divided by M times P ($f_{quant}/(M \times P)$).

30. The method of claim 29, wherein the quantizing step comprises quantizing the chopped signal by Δ-Σ modulation.

31. The method of claim 29, wherein the quantizing step comprises quantizing the chopped signal by single-bit Δ-Σ modulation.

32. The method of claim 29, wherein the quantizing step comprises quantizing the chopped signal by multi-bit Δ-Σ modulation.

33. The method of claim 29, wherein the quantizing step comprises quantizing the chopped signal by successive approximation quantization.

34. The method of claim 29, wherein the quantizing step comprises quantizing the chopped signal by flash quantization.

35. The method of claim 29, wherein the quantizing step comprises quantizing the chopped signal by pipelined quantization.

36. The method of claim 29, wherein the first predetermined frequency $f_{chop}$ equals the second predetermined frequency $f_{quant}$ divided by two times M ($f_{chop} f_{quant}/(2 \times M)$).

37. The method of claim 29, wherein P=2.

38. The method of claim 29, further comprising attenuating the digital output over a wide-band.

39. The method of claim 29, further comprising attenuating the digital output over a wide-band having a center frequency at about 55 Hz and attenuating 87 dB of the signal at about +−14% of the center frequency.

40. The method of claim 29, further comprising attenuating the digital output over a wide-band having a center frequency at 55 Hz.

41. A method for attenuating a digital signal over a wide-band attenuation comprising:

modulating an analog signal to produce a modulated signal;

filtering the modulated signal using a first digital filter to produce a first filtered signal;

filtering the first filtered signal to obtain the digital signal having a wide-band attenuation; and wherein the resulting signal exhibits attenuation characteristic across a wide-band frequency range defined by said filtering the modulated signal and said filtering the first filtered signal, said wide-band frequency range being centered at about 55 Hz.

42. The method of claim 41 further comprising attenuating greater than 87 dB of the digital signal over a frequency range of at least +−14% of the center frequency.

43. A method for producing a digital signal having a wide-band attenuation comprising:

modulating an analog signal to produce a modulated signal;

filtering the modulated signal using a first digital filter to produce a first filtered signal;

filtering the first filtered signal to produce the digital signal; and using the filtering the modulated signal and filtering the first filtered signal to attenuate the digital signal across a wide-band centered at a center frequency of about 55 Hz.

44. The method of claim 43 comprising attenuating the digital signal more than 87 dB over a frequency range of at least about +−14% of the center frequency.

* * * * *